United States Patent
Villain

(10) Patent No.: US 7,477,774 B2
(45) Date of Patent: *Jan. 13, 2009

(54) CHOICE OF REFERENCE MARKINGS FOR ENABLING FAST ESTIMATING OF THE POSITION OF AN IMAGING DEVICE

(75) Inventor: Nicolas Villain, Clamart (FR)

(73) Assignee: Koninklijke Philips Electronics N.V., Eindhoven (NL)

(*) Notice: Subject to any disclaimer, the term of this patent is extended or adjusted under 35 U.S.C. 154(b) by 655 days.

This patent is subject to a terminal disclaimer.

(21) Appl. No.: 10/482,141

(22) PCT Filed: Jul. 4, 2002

(86) PCT No.: PCT/IB02/02837

§ 371 (c)(1),
(2), (4) Date: Dec. 22, 2003

(87) PCT Pub. No.: WO03/005793

PCT Pub. Date: Jan. 16, 2003

(65) Prior Publication Data

US 2004/0151363 A1 Aug. 5, 2004

(30) Foreign Application Priority Data

Jul. 4, 2001 (EP) .................. 01401790

(51) Int. Cl.
*G06K 9/00* (2006.01)
*G06K 9/32* (2006.01)
*H04N 17/02* (2006.01)

(52) U.S. Cl. .................. 382/151; 382/294; 348/187

(58) Field of Classification Search ............... 382/151, 382/147, 141, 145, 209, 266, 199; 348/124–126, 348/87–89
See application file for complete search history.

(56) References Cited

U.S. PATENT DOCUMENTS 4,860,374 A * 8/1989 Murakami et al. .......... 382/151

(Continued)

OTHER PUBLICATIONS

Ji et al., "Machine Interpretation of CAD Data for Manufacturing Applications," ACM Computing Surveys, vol. 24, No. 3, 1997, pp. 264-311.*

(Continued)

Primary Examiner—Samir A Ahmed
Assistant Examiner—Andrae S Allison

(57) ABSTRACT

A method of estimating the position of the field of view of an imaging device, such as a camera, relative to a board involves designating markings on the board as references and detecting the shift in these reference markings within the field of view of the camera compared to a known position therein. The reference markings are selected such that detection thereof involves analysis of only a subset of the image produced by the imaging device. The selection of a group of one or more markings to serve as a reference involves determination of the image region (error window) in which the reference marking(s) may appear, given the maximal positional error of the imaging device. It is also checked (step T4) that the entire error window will be within the useable field of view of the imaging device and that, within the error window, no other group of markings will appear that could be confused with the selected group of markings (step T5). Detection of the reference group of markings involves generation of an image profile along a line crossing the center of the error window and finding the best match between the markings along this profile and the markings in the reference group.

15 Claims, 5 Drawing Sheets

U.S. PATENT DOCUMENTS

| | | | | |
|---|---|---|---|---|
| 5,930,406 A * | 7/1999 | Itsuzaki et al. | ............... | 382/291 |
| 5,974,169 A * | 10/1999 | Bachelder | .................. | 382/151 |
| 6,324,299 B1 * | 11/2001 | Sarachik et al. | ............ | 382/151 |
| 6,577,758 B1 * | 6/2003 | Kawata et al. | ............... | 382/151 |
| 6,748,104 B1 * | 6/2004 | Bachelder et al. | ........... | 382/151 |
| 6,915,008 B2 * | 7/2005 | Barman et al. | .............. | 382/154 |
| 6,917,698 B2 * | 7/2005 | Obi | ............................ | 382/151 |
| 7,110,591 B2 * | 9/2006 | Neubauer et al. | ........... | 382/147 |

OTHER PUBLICATIONS

Maganti et al,"Modular approach to automatic printed circuit board inspection", Proceedings of SPIE—vol. 2665 Machine Vision Applications in Industrial Inspection IV, A. Ravishankar Rao, Ning Chang, Editors, Feb. 1996, pp. 197-208.*

Altinkemer et al, "Optimization of printed circuit board manufacturing: Integrated modeling and algorithms", European Journal of Operational Research 124 (Mar. 2000) 409-421.*

Madhav et al, "Automatic PCB Inspection Algorithms: A Survey", Computer Vision and Image Understanding, vol. 63, issue 2, Mar. 1996, pp. 287-313.*

"Visual Servoing in PCB Manufacturing", F. de Jong and P.P. Jonker (Proc. ASCI 2000, 6th Annual Conference of the Advanced School for Computing and Imaging, ASCI, Delft, 2000, eds. J.J. van Vliet, J.W.J. Heijnsdijk, T. Kielman and P.M.W. Knijnenburg, pp. 59-63).

* cited by examiner

CHOICE OF REFERENCE MARKINGS FOR ENABLING FAST ESTIMATING OF THE POSITION OF AN IMAGING DEVICE

The present invention relates to the field of position estimation and, more particularly, to a method of estimating the position of the field of view of an imaging device, such as a camera, relative to a board or the like, based on localization, in the image produced by the device, of reference patterns on the board. An apparatus implementing the method is also described.

In "Visual servoing in PCB manufacture" by F. de Jong and P. P. Jonker (Proc. ASCI 2000, $6^{th}$ Annual Conference of the Advanced School for Computing and Imaging, ASCI, Delft, 2000, eds. L. J. van Vliet, J. W. J. Heijnsdijk, T. Kielman and P. M. W. Knijnenburg, pages 59-63) a method was proposed for estimating the position of the field of view of a camera with respect to a board, in this case a circuit board on which electronic components were to be placed. The camera is carried by a robot used for positioning the electronic components on the circuit board. The circuit board bears conductors which form geometrical patterns made up of straight segments. The proposed method involves determining the precise location of the camera's field of view based on the localization of several of these segments in the video image. The segments used in the method for estimating camera position can be termed "reference segments".

According to this known method it is, of course, necessary to be able to distinguish the reference segments from other segments appearing in the video image. The de Jong et al paper proposes to ensure that this can be done either by selecting unambiguous reference segments, making use of the distances between segments to form unambiguous groups of segments or making use of other unambiguous elements on the board (for example vias or fiducials). However, since vias are circular in form, in a position-estimation method using vias as the reference elements to be localized it is necessary to process image data in two dimensions in order properly to localize them. It is also disadvantageous to use fiducials as the reference elements to be localized, because these take up space on the board. Thus, it is preferable to base the position estimation on reference elements corresponding to the linear conductors. According to the de Jong et al paper, the entire video image is acquired and analyzed in order to find selected reference groups of conductors. The offset in position of each reference group is determined in a respective one dimension. Complete information as to the offset in position of the camera field of view relative to the board in two dimensions (following a translation along the x and/or y direction, and/or a rotation) is obtained by combining the one-dimensional offset data.

Although the described method is a promising technique for estimating the location of the camera's field of view, there are several problems. In particular, in time-critical applications, acquisition and analysis of the entire video image takes too long.

It is an object of the present invention to provide a method in which reference groups of one or more markings, for use in estimating the position of the field of view of an imaging device, are selected from amongst the markings displayed on a board to be imaged by the imaging device, and these reference groups are detected quickly and unambiguously using only small subsets of an image of the board.

The present invention provides a method of estimating the position of the field of view of an imaging device relative to a board bearing markings, the method comprising the step of estimating the position of the field of view of the imaging device based on changes in position of a selected set of reference groups of markings; characterized in that, for each selected reference group of markings, the change in position is determined by acquisition and analysis of image data of a corresponding subset of the board.

The position-estimation method of the present invention may include the steps of: selecting groups of one or more markings on the board to serve as respective reference groups, the field of view of the imaging device being at a first position relative to the board when the selected reference groups are at a nominal position in the field of view; using the imaging device to generate an image of a subset of the board corresponding to the nominal position of each respective reference group, at least one dimension of the subset image being substantially equal to or greater than twice the maximal positioning error of the imaging device; in each respective subset image, detecting the image of the corresponding reference group, and determining the offset between the nominal position of the reference group in the field of view of the imaging device and the detected position thereof; and determining the position of the field of view of the imaging device based on the determined offsets and based on the known relationship between the first position of the imaging device and the nominal position of the reference groups.

Using the position-estimation method of the present invention, only a sub-set of the image need be acquired and analyzed in order to determine the localization of a given reference group within that sub-set. Thus, it is no longer necessary to acquire and analyze the entire image and, consequently, processing time is reduced.

In order for such an approach to be successful it must be possible to define a region (called the "region of interest") of the image where the reference group is sure to appear. Thus, it is necessary that the position of the imaging device can be known with an inaccuracy that can be quantified. In general, in any given application the maximal positional error of the camera is known. Typically this will be expressed in terms such as "the position is accurate to ±1 mm" meaning that, considered in a system of orthogonal (x,y) co-ordinates, there may be up to 1 mm error in each of the x and y co-ordinates. In such an example, 1 mm constitutes what is termed here "the maximal positioning error". In view of the fact that, in preferred embodiments of the method according to the present invention, at least one dimension of the subset image of the board is equal to or greater than twice the maximal positioning error of the imaging device, it can be made certain that the corresponding reference group will appear in the analyzed subset image.

In this regard, it is advantageous that the markings used in the reference groups are geometrical elements. In the preferred embodiments of the invention, the markings are straight-line segments. If a selected straight-line segment has a length that is at least equal to twice the maximal positioning error distance then it is certain that this selected segment will appear in a subset image having the following properties:

a) it is centered upon the nominal position of the selected segment, and b) in a direction extending substantially perpendicular to the nominal orientation of the selected segment, it has a dimension substantially equal to or greater than twice the positioning error distance.

Thus, this subset image may be strip-shaped, having a relatively small size in the direction parallel to the nominal orientation of the selected segment.

In preferred embodiments of the invention, the step of selecting groups to serve as a reference involves a step of rejecting candidate reference groups made up of straight-line segments that are shorter than twice the maximal positioning error distance.

In order for the approach according to the invention to give an accurate result, it must be possible to distinguish each reference group from all the other groups of markings that may appear in the region of interest. The reference groups may be selected in a number of different ways in order to fulfil this condition.

Preferably the group or groups to serve as a reference are selected using the following steps: designating as a candidate group a group of one or more markings on the board; determining, based on the maximal positional error of the imaging device, the boundaries of an image region where the image of the candidate group can appear; and rejecting the candidate group if the determined image region is not completely included in the useable field of view of the imaging device.

It is further preferred that selection of the group or groups to serve as a reference involves analyzing a portion of the board, the portion corresponding to said image region, to determine whether said candidate group can be identified unambiguously; and selecting said candidate group to serve as a reference group only if the analysis step determines that the candidate group can be identified unambiguously in said portion of the board.

The method according to the preferred embodiment of the invention involves analysis of only selected subsets of the image and uses a priori knowledge concerning the maximal positional error of the camera so as to ensure that the analyzed subsets of the image correspond to regions where the respective reference groups of segments are sure to appear.

This, in combination with the particular selection that is made of segments or groups of segments to constitute the reference groups, ensures that the retained reference groups can be detected unambiguously. Thereby, the method according to the preferred embodiment of the invention enables fast and robust computation of the position of a camera with respect to a board.

In the preferred embodiments of the invention, it is advantageous if the evaluation as to whether or not a candidate group is unambiguous involves consideration of whether, in the subset of the image, there is any other group of markings having the same orientation as the respective marking(s) in the reference group (and spacing, if there is more than one marking in the candidate group).

In some cases, a reference group can be unambiguous if the subset of the image is scanned in a particular direction. For example, the reference group is the first group of two segments encountered when the subset of the image is scanned in a left-to-right direction. Accordingly, it can be advantageous to associate a reference group with a direction in which the corresponding subset of the image is to be scanned.

The present invention further provides apparatus having means for carrying out the above-described method. Preferably, the invention provides a system comprising a suitably programmed computer or a special purpose processor having circuit means which are arranged to process image data according to the above-described method. The system may be provided in an apparatus having means to acquire image data.

The present invention yet further provides a computer program product comprising a set of instructions for carrying out the above-described method.

The invention and additional features, which may be optionally used to implement the invention to advantage, are apparent from and elucidated with reference to the drawings described hereinafter.

FIG. 4 is a schematic representation of a second example of an image portion, in which:

The preferred embodiment of the present invention will be described below in the context of an application in which the position of the field of view of a camera is estimated with respect to a circuit board, with a view to ensuring accurate placement of electronic components upon the board. In this application, the camera will be repeatedly aligned with new circuit boards having the same layout of conductors, and with the sites of different conductors upon each board. However, the present invention is not limited to this application. On the contrary, it is applicable in general to cases where the position of the field of view of a camera is to be estimated with respect to a board displaying straight-line segments, or other markings.

Below, reference is made to "horizontal" and "vertical" lines, it is to be understood that these expressions are not absolute but refer to orientations parallel to the top and bottom, or to the sides, of a board, respectively.

Figure 1:
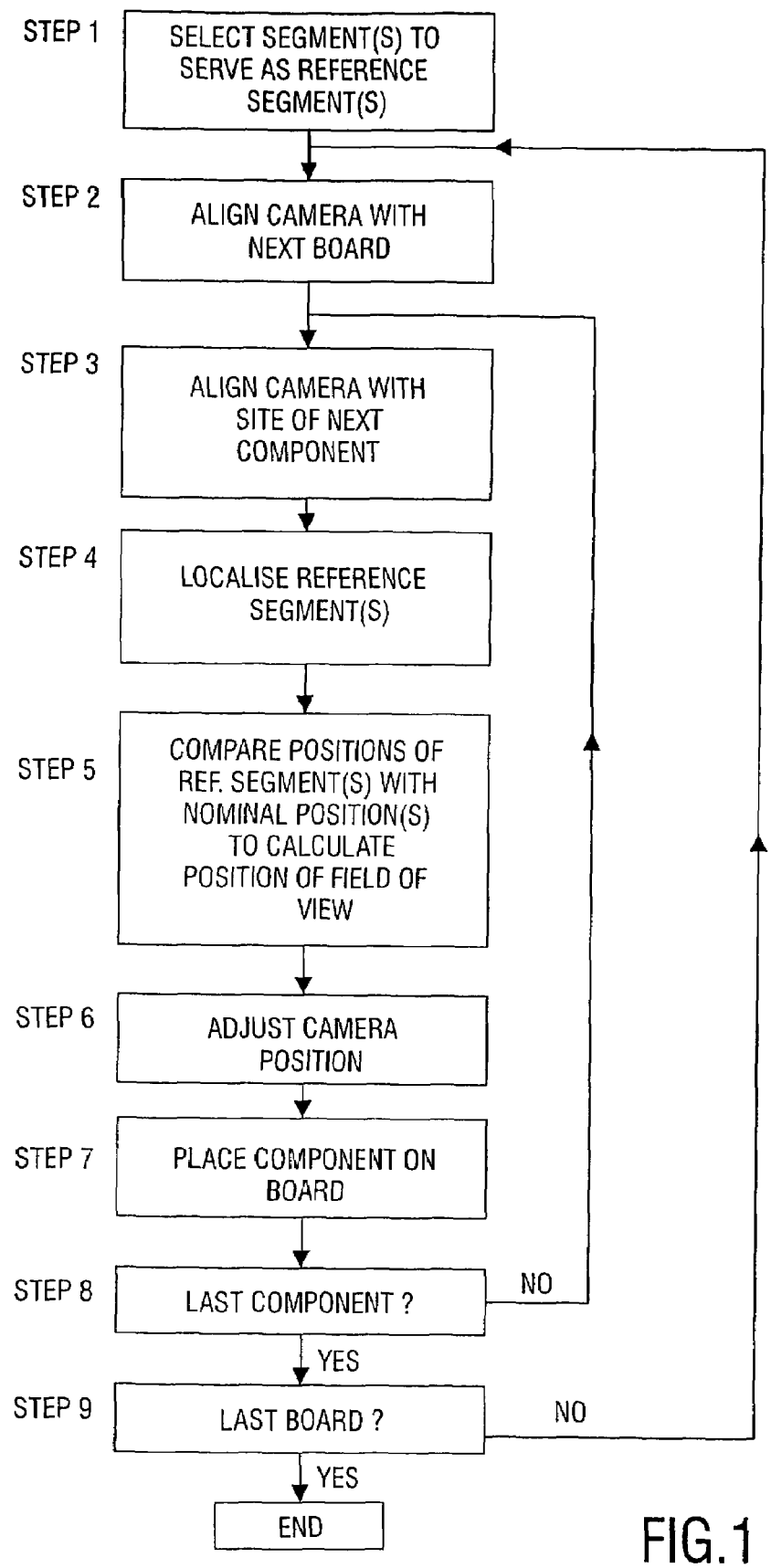
FIG. 1 is a flow diagram illustrating the major steps in a procedure according to the present invention for estimating the position of the field of view of a camera in an application where electronic components are to be placed on circuit boards.

FIG. 1 is a flow diagram illustrating the major steps of a procedure according to the present invention for estimating the position of the field of view of a camera, in an application where electronic components are placed on a circuit board at positions dependent upon this estimation.

In the first step of the procedure (STEP 1), the design of the board is analyzed in order to select which segments or patterns appearing on the board should be used subsequently as reference groups of segments. In general, the circuit board will be designed using computer aided design (CAD) software and so the details of the layout are readily available for computer analysis. It is preferred to perform the selection of the reference groups or segments directly on the CAD data representing the design of the board.

Alternatively, if the CAD data is unavailable, an image of an example of the board can be generated using an imaging device, and the selection based on analysis of this image data.

More details of the selection procedure according to the preferred embodiments of the invention will be given later, with reference to FIGS. 2 to 4.

Once the reference group(s) of segments have been selected, the camera is aligned with an example of the circuit board in question, with a certain degree of accuracy (STEP 2). This alignment may typically involve displacement of the camera or movement of a conveyor belt (carrying circuit boards) relative to a stationary camera. Next, the camera is aligned with the site where the first electronic component should be placed on the circuit board (STEP 3). Generally, the camera is carried by the robot that will physically place the electronic components on the circuit board, and the positional relationship between the camera's field of view and the placement device on the robot arm is known. The positioning error may involve an error in translation or rotation of the camera relative to the board and vice versa.

The camera generates an image only of selected subsets of the board, where respective reference groups of segments are sure to appear, and analyses each subset image.

This analysis (STEP 4) serves to determine the localization of the reference groups of segments. The determined positions of the reference group(s) are compared (STEP 5) with the positions that these groups should occupy in the image if the camera field of view had been in a predetermined reference position relative to the board.

In the presently-described application, as indicated above, the camera is carried by a robot which places electronic components on the circuit boards. The robot is programmed to place the electronic components at predetermined locations on the circuit board, with reference to the image in the camera's field of view. Once the actual position of the camera's field of view has been estimated, the position of the robot (and, thus, of the camera) can be adjusted (STEP 6) so that the first electronic component will be placed accurately at the desired location (STEP 7). Once the first electronic component has been positioned on the circuit board, it is checked (STEP 8) whether or not this is the last component to be placed. If there are more components to be placed on the board then the process returns to STEP 3 of FIG. 2, and the camera is aligned with the site where the next component should be placed on the circuit board.

Once all the components required for the current board have been placed, a check is made as to whether or not this is the last board requiring treatment. If "no", then STEPs 2 to 8 of the procedure are repeated. If "yes", then the procedure ends.

The procedures required for aligning the camera with the circuit board and component site (STEPs 2 and 3) are well-known and so will not be described further here.

Similarly, because they are described in the de Jong paper cited supra, the skilled man has no need of further description of the way in which the change in location of reference segments enables calculation of the position of the camera's field of view (STEP 5), or the way in which a robot adjusts its position and places electronic components on a circuit board based on such a calculated position (STEPs 6 and 7). Moreover it is a trivial matter to determine whether the component just placed on the board is the last component, or the current board being processed is the last board requiring processing (STEPs 8 and 9).

However, the preferred embodiments of the present invention provide special measures for selecting the groups of one or more segments to serve as reference groups (STEP 1) and for localizing the selected reference groups (STEP 4). Accordingly, these steps will now be described in greater detail.

Because of errors in the positioning of the camera relative to the imaged board, each marking or segment in the field of view of the camera may appear in the image at a different location from that expected. However, the maximal positional error of the camera is known, so it is possible to define a limited region within the image where a given point on the board must appear. This limited region is termed the "error window", see FIG. 3. For example, if the maximal positioning error of the camera is ±1 mm (both in the x direction and the y direction, considered in terms of orthogonal (x,y) co-ordinates), then the error window will be 2 mm by 2 mm. In the above-described application, the segments under consideration are preferably straight-line conductor portions. The error window is centered on the nominal position of the center of the straight-line segment under consideration. The size of the error window increases slightly when it is desired to image a group of neighboring segments. For example, if it is desired to localize the image of a pair of neighboring vertical straight-line segments having centers spaced apart by a distance D, then the error window will have a width equal to (twice the maximal positioning error in the widthwise direction)+D.

When selecting groups of one or more segments to serve as reference groups in estimating the position of the camera's field of view it is necessary that the selected groups of segments should satisfy the following two conditions:

1) the error window applicable to this selected group must be completely included in the camera's useable field of view, and
2) this selected group must not be confusible with any other group of segments that may appear in the camera's field of view, in other words the selected group must be unambiguous.

The first condition will tend to exclude segments that lie close to the edges of the camera's field of view because errors in the relative positions of the camera and the board could lead to the error window for such segments falling partially outside the field of view of the camera. It will also exclude conductors which are masked wholly or in part from the camera's view. Masking can occur, for example, because the robot arm is between the camera and parts of the board, or because portions of the board are masked by a component being held by the robot arm or by components already placed on the board.

Also, it is preferred to exclude short segments from consideration. Here, "short segments" refers to straight-line segments the length of which is less than twice the maximal positioning error of the camera in the direction in which the segment extends (taking into consideration the fact that the maximal positioning error might differ in different directions).

If a segment is at least twice as long as the maximal positioning error of the camera in the direction in which the segment extends, then that segment is sure to be detected if a profile is taken along a line oriented substantially perpendicular to the segment, twice as long as the maximal positioning error of the camera in the direction along which the profile is taken, and the center of the profile being located at the nominal position of the center of the segment.

Thus, it is only necessary to acquire image data along such a profile, rather than over a substantial portion of the board.

With regard to the second condition, two or more segments could be confusible if they have the same width and orientation. In practice, the width of conductors on a single circuit board is fairly constant, but there can be variation from one board to another in a production run. Therefore, width is not a useful parameter for differentiating one conductor from another. If it were to be desired to differentiate segments from each other on the basis of their orientation then the processing time involved would be relatively long if it was necessary to detect small differences in orientation (for example 10°). In practice, conductors on a circuit board are either horizontal (parallel to the top and bottom of the board), vertical (parallel to the sides of the board) or diagonal. There is little processing involved in distinguishing between these three basic orientations.

In view of the above, in the case where a single segment is selected as a reference group, the second condition is considered to be fulfilled if in the error window for the selected segment there is no other segment having the same orientation as the selected segment. In the case where a plurality of segments are chosen as a reference group, the second condition is considered to be fulfilled if in the error window for this selected group of segments there is no other group of segments having the same orientation and spacing (spacing being measured between the centers of the segments).

When determining whether or not a given segment is ambiguous, it can also be advantageous if the contents of the error window are scanned in a particular direction, for example left-to-right, or right-to-left (or top-to-bottom, or bottom-to-top, in the case of reference segments which extend horizontally). For example, even if there is more than one vertical segment in the error window, the first segment to be encountered when scanning the error window left-to-right is unambiguous (as is the first segment to be encountered when scanning right-to-left). During the assessment of whether or not a given candidate group is unambiguous, the error window may be scanned in both directions (left-to-right as well as right-to-left for vertical segments, and top-to-bottom as well as bottom-to-top for horizontal segments), and data stored as to which scanning direction yields an unambiguous group.

There will now be described, with reference to FIGS. 2 to 4, a preferred process for selecting individual segments, or groups of segments, to serve as a respective reference group when estimating the position of a camera's field of view relative to a board bearing the segments. In practice, it is preferred that there should be a limit (n) on the number of segments in any groups of segments that are used as a reference for estimating the position of the camera's field of view. In the absence of such a limit, the selection of reference segments, and the detection of reference segments during the position-estimation process, can involve an analysis of a region of substantial size, rather than analysis of small subsets of the image.

Moreover, each reference group yields one piece of positional information, regardless of the size of the reference group. Thus, the processing time is increased for little benefit if the size of a reference group increases. Ideally, each reference group would consist of a single segment. However, typically, in an application involving placing of components on a circuit board, n would be set to around 3.

Figure 2:
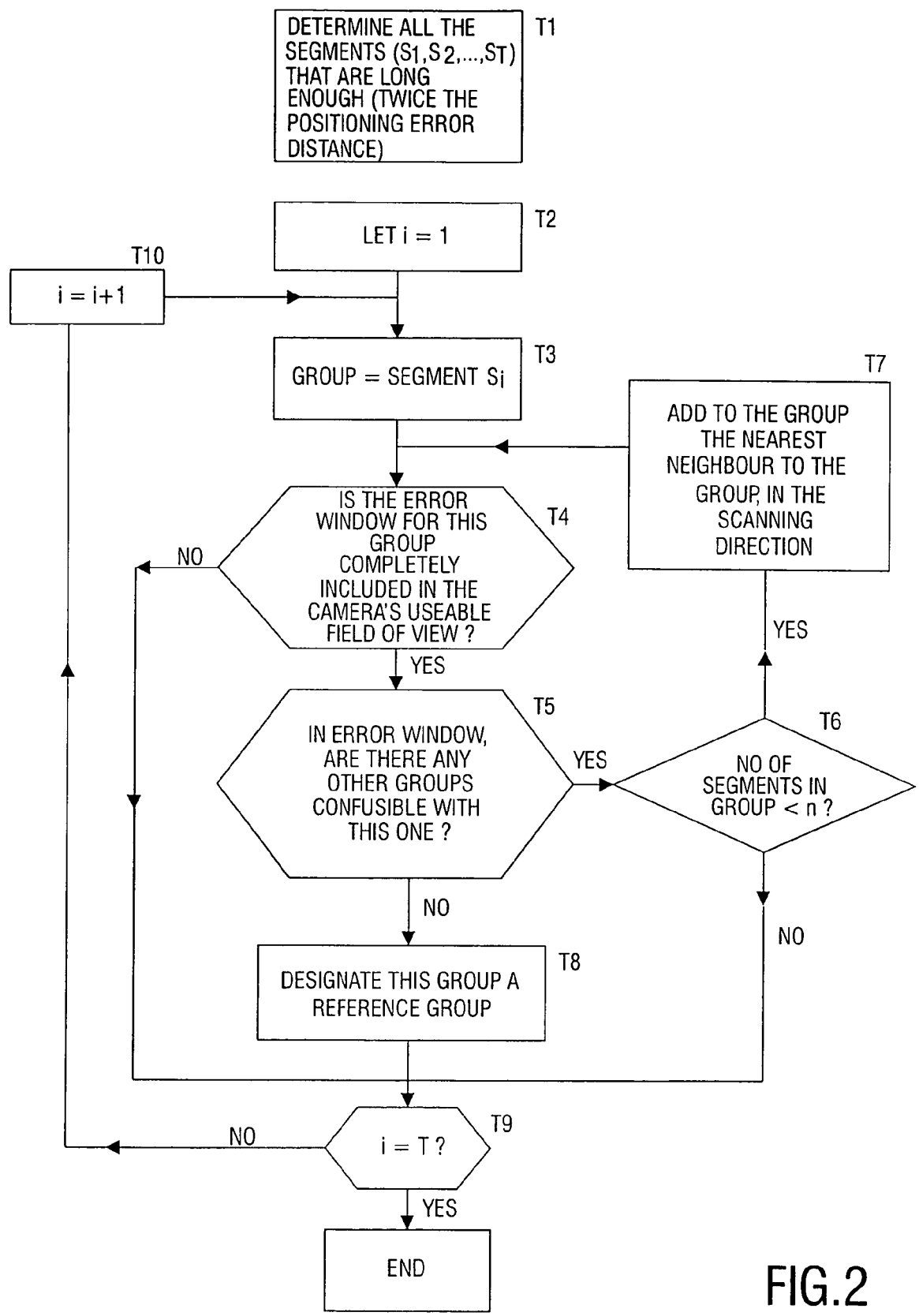
FIG. 2 is a flow diagram of the main steps in a preferred process for selecting segments to serve as reference segments.
Figure 3:
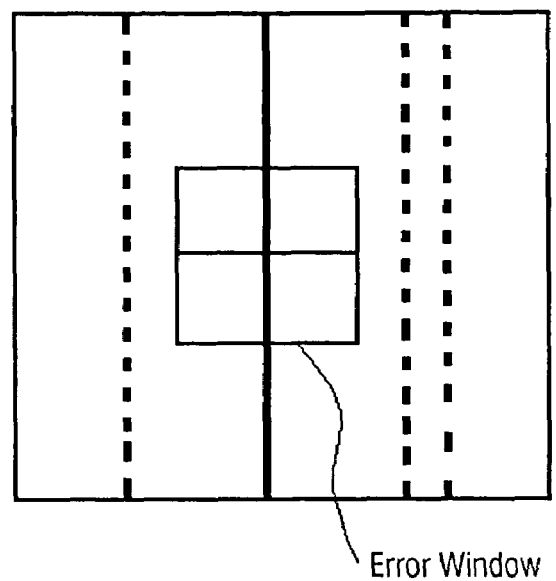
FIG. 3 is a schematic representation of a first example of an image portion.

FIG. 2 illustrates the main steps of the preferred process for selection of reference groups, whereas FIGS. 3 and 4 show examples of image portions containing candidate groups of segments undergoing assessment for suitability as reference groups. In FIGS. 3 and 4 a candidate group of segments that is undergoing assessment for suitability to serve as a reference is shown as a solid line, whereas other segments appearing in the same image portion but not undergoing such assessment are shown as broken lines.

As shown in FIG. 2, as a first step (T1) it is preferred to consider as candidates to be reference segments only those segments that are twice as long as the maximal positioning error of the camera in the direction in which the respective segment extends These candidate segments are then assessed, in turn, for their suitability to be used as reference groups, with regard to conditions 1) and 2) mentioned above. More particularly, the first segment ($S_1$) is chosen for evaluation (steps T2 and T3 of FIG. 2) and it is determined (in step T4 of FIG. 2) whether or not above-mentioned condition 1) is fulfilled for this segment.

If "no", that is the error window for this segment is not completely included in the camera's useable field of view, then this segment is unsuitable for use as a reference group and the process moves on to analyze the next candidate segment ($S_2$)—via steps T9 and T10 of FIG 2.

If the result of the evaluation in step T4 is "yes", it is next determined (in step T5 of FIG. 2) whether or not there are any other segments in the error window that could be confused with the candidate segment. More particularly, for a candidate group consisting of a single segment, it is checked whether this segment is the only one having its orientation or is the first/last segment encountered when scanning the error window in a specified direction.

For a candidate group consisting of several segments it is checked whether this group is the only one in the error window having its orientation and spacing and/or whether this is the first/last group in the error window.

If there are no other groups confusible with the candidate reference group this means that the candidate segment under consideration is unambiguous and is suitable for use as a reference group when estimating the position of the camera's field of view. This segment is then designated as a "reference group" in step T8 of FIG. 2, and steps T3 to T5 are repeated for the next candidate segment (S2 or, more generally, $S_{i+1}$). FIG. 3 shows an example of an image portion containing an individual candidate segment that is suitable to be designated as a reference group: in other words, for the illustrated segment, conditions 1) and 2) are met.

Incidentally, in FIGS. 3 and 4 the line shown crossing the error window horizontally is a line along which an image profile would be acquired in order to detect the reference group (see below).

Figure 4A:
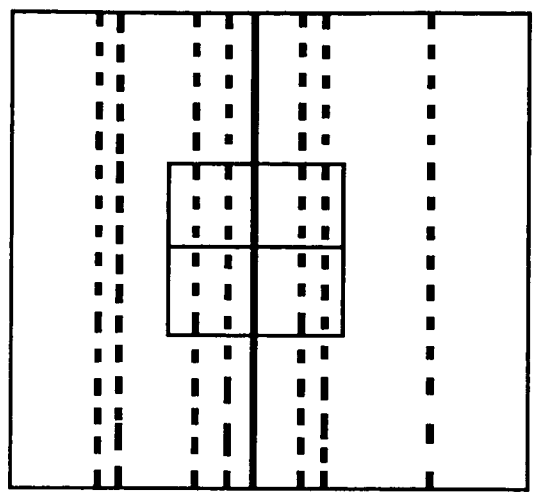
FIG. 4A illustrates the case where a single segment is considered as a candidate reference group of segments.

If the evaluation in step T5 shows that there are other segments confusible with the candidate segment, this means that the candidate segment under consideration is ambiguous. FIG. 4A shows an example of an image portion containing an individual candidate segment that is ambiguous because the error window contains other segments having the same orientation, and the candidate segment is not the first/last in the error window when scanned in a particular direction. In such a case, it is preferred to enlarge the group of segments under consideration by adding the closest parallel neighbor to the candidate group, provided that the group under consideration has fewer than n members (steps T6 and T7 of FIG. 2). It is also preferred that the added nearest-neighbor should be on the side that is encountered first when the error window is scanned in the above-mentioned particular direction. It is then evaluated (by repeating steps T4 and T5 with respect to the enlarged group of segments) whether or not this enlarged group of segments meets conditions 1) and 2) above. Because the number of segments in the group is increased, the size of the error window must be correspondingly increased. If the result of repeating steps T4 and T5 is a determination that the enlarged group is still ambiguous, then a further segment can be added to the candidate group, and steps T4 and T5 repeated once again, and so on, until the number of segments in the candidate group reaches the limit n.

Figure 4B:
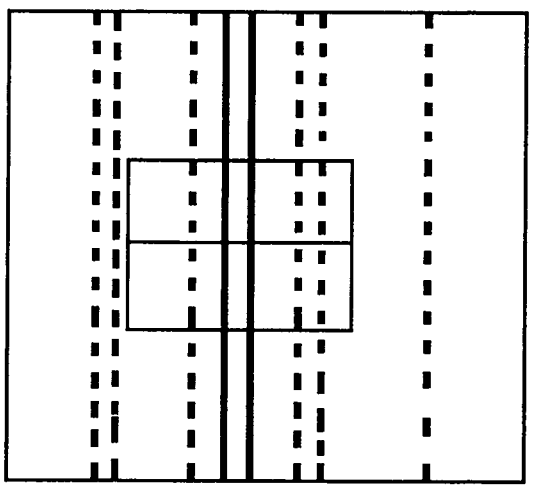
FIG. 4B illustrates the case where a pair of neighboring segments is considered as a candidate reference group of segments.
Figure 4C:
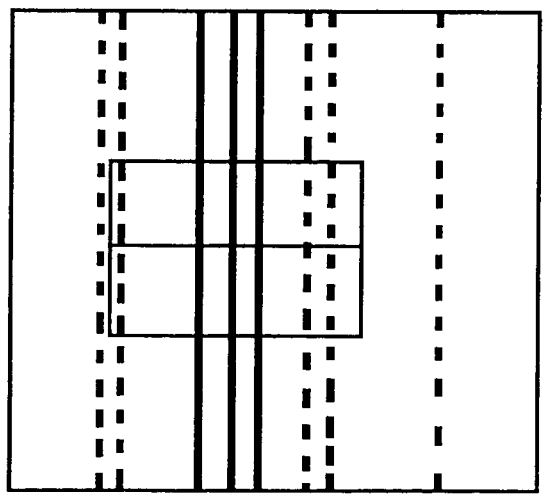
FIG. 4C illustrates the case where a group of three neighboring segments is considered as a candidate reference group of segments.

FIG. 4B illustrates the case where a second segment is added to the "group" consisting of the candidate segment of FIG. 4A. The resulting enlarged candidate group is still ambiguous, so it is necessary to add a further segment to the group, as shown in FIG. 4C. This further-enlarged candidate group is now unambiguous and can be designated suitable for use as a reference.

In the case where the error window is scanned in a particular direction, and certain reference groups are unambiguous due to being first or last in the scanning direction, it is necessary to store data identifying what is the direction in which the error window should be scanned. Since, typically, some reference groups will be oriented horizontally, others vertically (and possibly others diagonally), this scanning-direction data is stored associated with respective reference groups.

When it is determined (step T9 of FIG. 2) that all of the possible candidate segments have been analyzed, the process ends. The result of the process is a list of groups of segments (N.B. here a "group" may be constituted by an individual segment) that are designated as "reference groups" together with, for each group, data indicating the nominal position of the center of the group, the spacing between the segments in the group, the orientation of the segments and, where applicable, the preferential direction of scanning.

In fact, although these groups of segments are all suitable to serve as references in estimating camera position, it is not essential that all of them be used. In order to reduce processing time during camera position-estimation, a choice can be made of a subset of these suitable groups of segments. The more reference groups that are used the better will be the accuracy of the position estimate but the longer will be the processing time. There is obviously a compromise to be reached. However, in the preferred embodiments, since each reference group yields positional offset information in one dimension, it is necessary to use at least 2 or 3 reference groups. It is to be understood that a different selection of reference groups can be used for position estimation at the site of each respective electronic component to be placed on the board.

Figure 5:
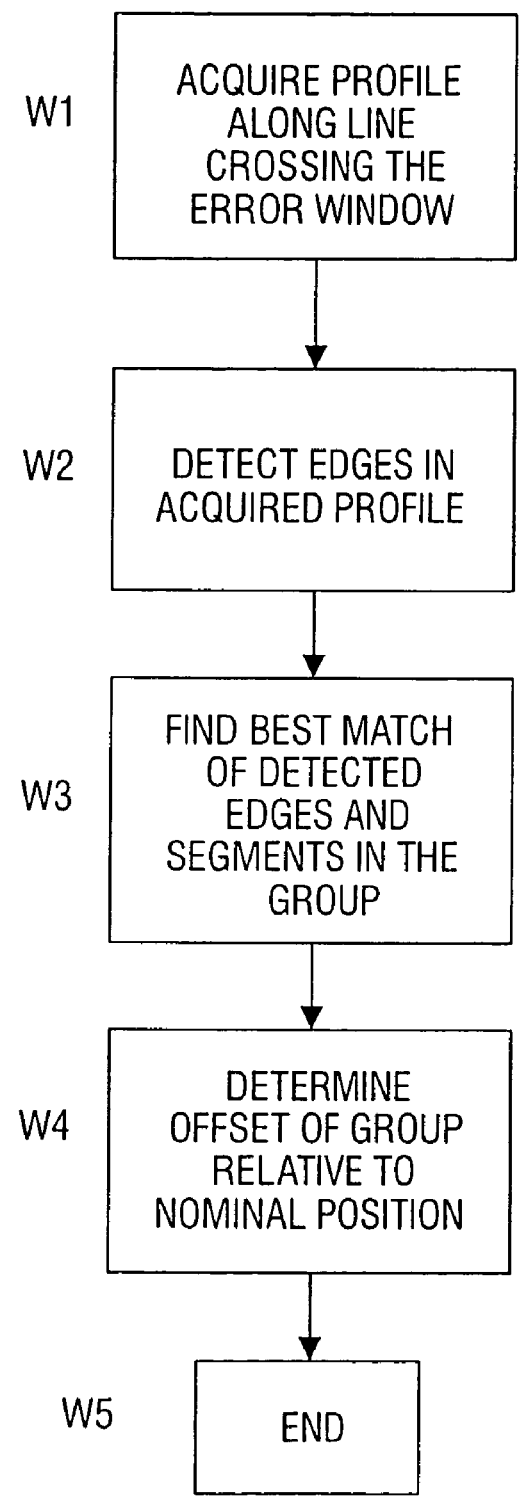
FIG. 5 is a flow diagram illustrating the main steps in a preferred process for detecting a reference group of segments.

Let us presume that a choice has been made as to which groups of segments are to serve as reference groups during the process of estimating the position of the camera's field of view. During the position-estimation process it is then necessary to detect and localize the selected reference group(s) of segments in the video image the camera generates of the board. FIG. 5 illustrates the main steps of a preferred process for detecting and localizing a reference group of segments (it is to be recalled that a "group" may consist of a single segment). This process is repeated for each reference group that is to be used in estimating camera position.

For the selected reference group of segments, the image of a subset of the board in which the reference group is certain to appear is acquired (step W1 of FIG. 5). In the preferred embodiments of the invention, this subset image is a profile taken along a line crossing the center of the error window, preferably substantially perpendicular to the orientation of the segments in the reference group. The length of the acquired image profile corresponds to twice the maximal positioning error of the camera in the direction along which the profile is taken. The central point of the profile is the nominal position of the center of the reference group. Preferably, the image profile is acquired along a line a few pixels wide, such as 5 pixels wide, and the image data across the five pixels is averaged.

Amongst other things this ensures that discontinuities in the image data caused by defects in the imaging process are not mistakenly interpreted as edges of segments.

The acquired profile is next analyzed (in step W2 of FIG. 5) so as to detect the changes in brightness that correspond to segment edges, using standard edge detection techniques.

Next (in step W3 of FIG. 5), an attempt is made to find the best match between the detected edges and the segment edges of the reference group. The matching process considers the expected orientation of the segment or segments in the reference group and, in a case where the reference group contains several segments, it considers also the expected spacing between the segments. In the case where a scanning direction is associated with the reference group, the matching process involves a scan of the edges in the image profile along the specified scanning direction. The matching process uses standard mathematical and trigonometric techniques, and so there is no need to describe it in detail.

Once a set of edges has been identified in the acquired profile and evaluated to be the best match with the reference group, the offset between the actual location of this set of edges and the nominal position thereof is determined (in step W4 of FIG. 5). This offset is a measure of the offset, in one dimension, of the camera's field of view compared with a predetermined position thereof corresponding to a nominal location of the reference group.

In practice, the one-dimensional offset information yielded from localization of one reference group is insufficient to estimate the position of the camera's field of view with desirable accuracy. It is preferable to generate the estimate based on the offsets calculated for a set of reference groups, preferably involving segments extending both parallel to and perpendicular to the edges of the circuit board. The set of offsets calculated for the set of reference groups will indicate whether the field of view of the camera has undergone a translation, a rotation or a combination of the two, relative to the predetermined position thereof relative to the board. The mathematics required to calculate the change in position of the camera's field of view, based on a given pattern of calculated offsets, is straightforward and so will not be described in detail here (but see, for example, the de Jong et al paper cited supra).

Figure 6:
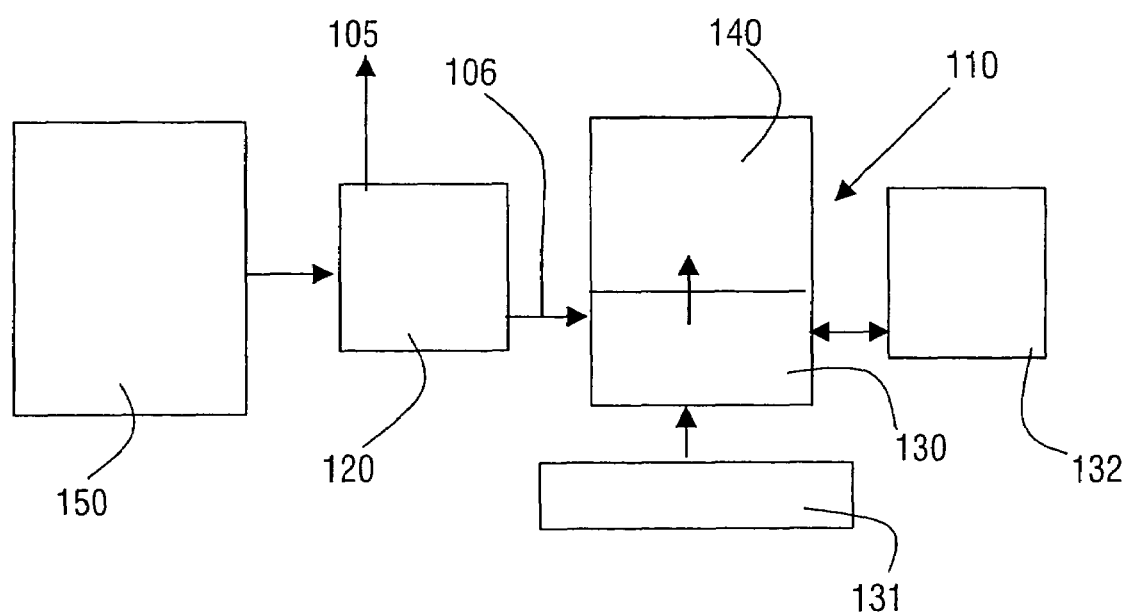
FIG. 6 is a schematic representation of an apparatus suitable for putting into practice the method according to the present invention.

The present invention provides apparatus for putting the above-described method into practice, as represented schematically in FIG. 6.

Referring to FIG. 6, the apparatus according to the invention incorporates means 150 for acquiring digital image data, and a digital processing system 120 for processing this data according to the processing method above-described. The image data acquisition means 150 may incorporate the above-described camera or may be an interface (physical, or software-implemented) receiving image data from the camera. The digital processing system 120 may be adapted both to perform the initial selection of reference groups of markings and to perform the processing involved in detecting and localizing the reference groups and calculating the estimate of the position of the camera's field of view.

Alternatively, the initial selection of reference groups of markings may be made by a separate processing apparatus. In the latter case, the digital processing system 120 is provided with data at least identifying the selected reference groups and indicating their nominal locations.

The image data acquisition means 150 provides image data to the processing system 120 which has at least one output (in this example the processing system 120 has two outputs 105, 106). The processing system 120 may output position estimate data to display and/or storage means 130, 140, via the first output 106. Typically the position estimate data will be in the form of numerical data but any convenient representation could be used (for example, a graphical representation showing the estimated position of the camera's field of view relative to a representation of the board). The display and storage means may respectively be the screen 140 and the memory 130 of a workstation 110. Said storage means may alternatively be external storage means.

In an application such as that described above, where the position estimate is used in servo control of the position of a robot arm, the processing means 120 may also perform the calculations necessary to adjust the position of the robot. In such a case, the processing means 120 may output position-control data to the robot, via the output 105.

This data processing system 120 may be a suitably programmed computer of the workstation 110, or a special purpose processor having circuit means such as Look-Up Tables (LUTs), Memories, Filters, Logic Operators, that are arranged to perform the functions of the method steps according to the invention. The workstation 110 may also comprise a keyboard 131 and a mouse 132. The processing system 120 may use a computer program product having program instructions to be executed by the computing means of said processing system in order to carry out the above-described method.

The drawings and their description hereinbefore illustrate rather than limit the invention. It will be evident that there are numerous alternatives that fall within the scope of the appended claims. In this respect the following closing remarks are made.

The present invention has been described in the context of estimating the position of the field of view of a camera relative to a circuit board bearing segments constituted by conductor paths, with a view to enabling circuit components to be placed accurately on these paths. As mentioned above, the invention is not limited to this application and, specifically, references herein to a "board" refer to any medium bearing markings that can be imaged. Furthermore, references to a "camera" should be understood as covering varied kinds of imaging devices not limited to conventional still or video cameras. Moreover, the color of the markings and of the board under consideration is immaterial to the present invention so long as there is a discernible contrast between the markings and the board.

Similarly, the preferred embodiments of the invention make use of reference groups of straight-line segments of length at least twice the maximal positioning error of the imaging device. In this way, the subset image need be acquired only along a thin profile. It is to be understood that shorter segments can be used but that this will increase the size of the subset image that must be acquired.

Any reference sign in a claim should not be construed as limiting the claim.

The invention claimed is:

1. A method of estimating the position of the field of view of an imaging device relative to a board having markings visible thereon, the method comprising the step of:
   estimating the position of the field of view of the imaging device based on changes in position of a selected set of reference groups of markings, wherein for each selected reference group of markings, the change in position is determined by acquisition and analysis of image data of a corresponding;
   selecting group(s) of one or more markings on the board to serve as respective reference group, the field of view of the image device being at a first position relative to the board when the selected reference group(s) are at a nominal position in the field of view;
   using the image device to generate an image of a subset of the board corresponding to the nominal position of each respective reference group, at least one dimension of the subset image being substantially equal to or greater than the maximal positioning error of the image device in each respective subset image, detecting the image of the corresponding reference group, and determining the offset between the nominal position of the reference group in the field of view of the image device and the detected position thereof; and
   determining the position of the field of view of the image device based on the determined offsets and based on the known relationship between the first position of the image device and the nominal position of the reference group(s).

2. The position-estimation method of claim 1, wherein the group-selecting step comprises:
   designating as a candidate group a group of one or more markings on the board;
   determining, based on the maximal positional error of the imaging device, the boundaries of an image region where the image of the candidate group can appear; and
   rejecting the candidate group if the determined image region is not completely included in the useable field of view of the imaging device.

3. The position-estimation method of claim 2, wherein the group-selecting step comprises:
   analyzing a portion of the board, the portion corresponding to said image region, to determine whether said candidate group can be identified unambiguously; and
   selecting said candidate group to serve as a reference group only if the analysis step determines that the candidate group can be identified unambiguously in said portion of the board.

4. The position-estimation method of claim 3, wherein the analyzing step comprises the step of assessing whether, in the determined portion of the board, there is any other group of one or more markings having the same spacing, or the same spacing and orientation, as marking(s) constituting the candidate group, and designating the candidate group ambiguous if any such other group is found in the portion of the board.

5. The position-estimation method of claim 3, wherein the analyzing step comprises the step of scanning said image region in a specified direction whereby to assess whether the candidate group is the first or last group scanned and, if the candidate group is the first or last group scanned, designating the candidate group unambiguous and associating therewith data identifying the specified scanning direction.

6. The position-estimation method of claim 4, and comprising the step of, in the case where the candidate group is designated ambiguous:
   enlarging the candidate group by addition of one or more markings constituting a near neighbor to the candidate group;
   assessing whether, in the determined subset of the generated image, there is any other group of markings having the same spacing and orientation as the markings constituting the enlarged candidate group;
   designating the enlarged candidate group ambiguous if any such other group is found in the portion of the board; and
   for an ambiguous enlarged group, repeating the enlarging and assessing steps.

7. The position-estimation method of claim 6, wherein the enlarging step is not performed or repeated if the number of markings in the candidate group after enlargement would exceed a threshold number.

8. The position-estimation method of claim 2, wherein the group-selecting step comprises repeatedly applying the step of designating one or more markings as a candidate group until all non-rejected markings in the field of view of the imaging devise have been considered as candidate groups.

9. The position-estimation method of claim 2 wherein the step of detecting the image of a reference group comprises the steps of:
   determining, based on a maximal positional error of the imaging device, the boundaries of an error window where the image of the reference group can appear;

detecting the markings in the error window; and finding the set of one or more markings in the error window best matching the one or more markings in the referenced group.

10. The position-estimation method of claim 9, wherein the step of detecting the markings in the error window comprises detecting the boundaries of markings in the error window; and the step of finding the best matching set of markings in the error window comprises finding the set of boundaries best matching the boundary(ies) of the marking(s) in the referenced group.

11. A method for estimating a position of a view of an imaging device relative to a board having markings thereon based on changes in position of a selected set of reference groups of the markings, comprising the steps of:

selecting for consideration as candidate groups of markings only straight-line segments on the board;

rejecting segments that are shorter than twice the maximal positioning error of the imaging device in the direction along which the respective segment extends; and acquiring and analyzing image data of a corresponding subset of the board to determine the changes in position of the selected set of reference groups of the markings;

wherein the step of generating an image of a subset of the board comprises acquiring a profile along a line crossing the center of the error window, said line being oriented substantially perpendicular to the normal orientation of the segments in the respective reference group and having a length at least twice the maximal positioning error of the imaging device in the direction along which the profile is taken.

12. The position-estimation method of claim 9, wherein the step of finding the best matching set of markings comprises evaluating at least one of the orientation and spacing of the markings.

13. An apparatus comprising: a processor adapted to acquire image data of a subset of a board corresponding to a selected reference group of markings, determine the change in position of the selected reference group of markings by analyzing the image data, and estimate the position of the field of view of an imaging device producing the image data relative to the board based on said changes in position of the selected reference group of markings;

select groups of one or more markings on the board to serve as respective reference groups, the field of view of the imaging device being at a first position relative to the board when the selected reference groups are at a nominal position in the field of view; in each respective subset image, detect the image of the corresponding reference group, and determine the offset between the nominal position of the reference group in the field of view of the imaging device and the detected position thereof; and determine the position of the field of view of the imaging device based on the determined offsets and based on the known relationship between the first position of the imaging device and the nominal position of the reference group(s); and an imaging device adapted to generate an image of a subset of the board corresponding to the nominal position of each respective reference group, at least one dimension of the subset image being substantially equal to or greater than the maximum positioning error of the image device.

14. A computer program product for estimating the position of the field of view of an imaging device relative to a board having markings visible thereon comprising computer readable media having encoded thereon:

computer readable program code for selecting groups of one or more markings on the board to serve as respective reference groups, the field of view of the imaging device being at a first position relative to the board when the selected reference groups are at a nominal position in the field of view;

computer readable program code for selecting groups of one or more markings on the board to serve as respective reference groups, the field of view of the imaging device being at a first position relative to the board when the selected reference groups are at a nominal position in the field of view;

computer readable program code for acquiring image data of a subset of a board corresponding to the nominal position of each respective reference group, at least one dimension of the subset image being substantially equal to or greater than the maximum positioning error of the image device;

computer readable program code for detecting the image of the corresponding reference group in each respective subset image, and determining the offset between the nominal position of the reference group in the field of view of the imaging device and the detected position thereof;

computer readable program code for determining offsets and based on the known relationship between the first position of the imaging device and the nominal position of the reference group(s).

15. An apparatus according to claim 13 associated with a digital imager producing digital image data corresponding to at least the subset of the board such that said apparatus has access to said data.

* * * * *